United States Patent
Cheng

(10) Patent No.: US 12,471,506 B2
(45) Date of Patent: Nov. 11, 2025

(54) PHASE-CHANGE MEMORY CELL WITH REDUCED HEATER SIZE

(71) Applicant: International Business Machines Corporation, Armonk, NY (US)

(72) Inventor: Kangguo Cheng, Schenectady, NY (US)

(73) Assignee: International Businesss Machines Corporation, Armonk, NY (US)

( * ) Notice: Subject to any disclaimer, the term of this patent is extended or adjusted under 35 U.S.C. 154(b) by 683 days.

(21) Appl. No.: 17/654,269

(22) Filed: Mar. 10, 2022

(65) Prior Publication Data
US 2023/0292637 A1    Sep. 14, 2023

(51) Int. Cl.
*H10N 70/20*    (2023.01)
*H10N 70/00*    (2023.01)
*H10B 63/00*    (2023.01)

(52) U.S. Cl.
CPC ......... *H10N 70/231* (2023.02); *H10N 70/826* (2023.02); *H10N 70/8413* (2023.02); *H10N 70/8613* (2023.02); *H10B 63/84* (2023.02); *H10N 70/023* (2023.02); *H10N 70/043* (2023.02); *H10N 70/063* (2023.02); *H10N 70/066* (2023.02); *H10N 70/068* (2023.02); *H10N 70/841* (2023.02); *H10N 70/8828* (2023.02)

(58) Field of Classification Search
CPC ............. H10N 70/231; H10N 70/8413; H10N 70/8613; H10N 70/861
See application file for complete search history.

(56) References Cited

U.S. PATENT DOCUMENTS

| | | |
|---|---|---|
| 6,339,544 B1 | 1/2002 | Chiang |
| 6,555,860 B2 | 4/2003 | Lowrey |
| 6,597,009 B2 | 7/2003 | Wicker |
| 6,649,928 B2 * | 11/2003 | Dennison ........... H10N 70/8413 257/4 |
| 7,229,887 B2 | 6/2007 | Dennison |
| 7,880,123 B2 | 2/2011 | Kim |
| 7,964,861 B2 | 6/2011 | Ricker |
| 8,003,972 B2 | 8/2011 | Liu |

(Continued)

FOREIGN PATENT DOCUMENTS

JP    2012142395 A    7/2012

*Primary Examiner* — Peter M Albrecht
(74) *Attorney, Agent, or Firm* — Kimberly Zillig

(57) ABSTRACT

A phase-change memory device with reduced heater size includes a first conductive structure within a first dielectric layer. A heater element is located within a second dielectric layer disposed above the first conductive structure. The heater element includes a third dielectric layer defining a perimeter, a top portion of a heater material layer partially overlapping the perimeter of the third dielectric layer, and a bottom portion of the heater material layer overlapping the perimeter of the third dielectric layer. The bottom portion of the heater material layer is in contact with the first conductive structure. A phase-change material is located above the heater element with a bottom surface of the phase-change material being in contact with the top portion of the heater material layer. The phase-change memory device further includes a second conductive structure located above the phase-change material.

18 Claims, 10 Drawing Sheets

(56) References Cited

U.S. PATENT DOCUMENTS

| | | | | |
|---|---|---|---|---|
| 2009/0045385 | A1* | 2/2009 | Happ | H10N 70/231 |
| | | | | 257/2 |
| 2010/0090285 | A1* | 4/2010 | Graf | H01L 23/485 |
| | | | | 257/368 |
| 2010/0327251 | A1* | 12/2010 | Park | H10N 70/8413 |
| | | | | 257/2 |
| 2011/0233503 | A1* | 9/2011 | Hwang | H10N 70/8413 |
| | | | | 257/2 |
| 2013/0146957 | A1* | 6/2013 | Cheng | H10D 86/201 |
| | | | | 257/301 |
| 2017/0117276 | A1* | 4/2017 | Cai | H10D 30/024 |
| 2021/0091307 | A1* | 3/2021 | BrightSky | H10N 70/8413 |

* cited by examiner

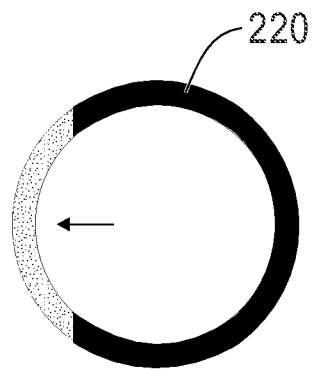
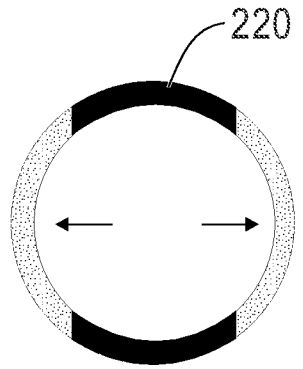
FIG. 7A    FIG. 7B
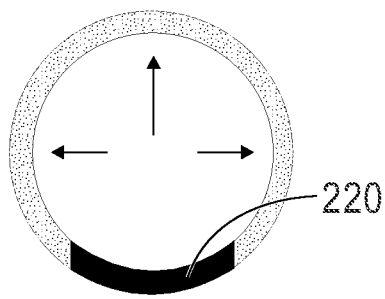
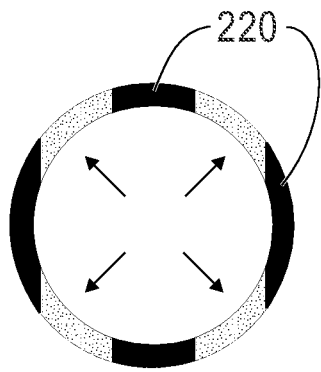
FIG. 7C    FIG. 7D
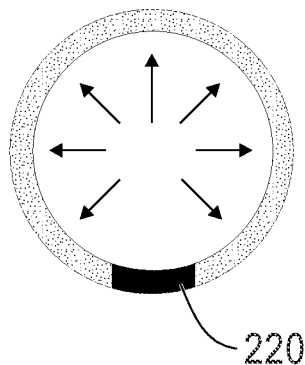
FIG. 7E

1010

```
┌─────────────────────────────────────────────────────────────┐
│ Forming a first conductive structure within a first          │
│ dielectric layer                                             │
│ 1020                                                         │
└─────────────────────────────────────────────────────────────┘
                              ↓
┌─────────────────────────────────────────────────────────────┐
│ Forming a heater element within a second dielectric layer    │
│ disposed above the first conductive structure, the heater    │
│ element including a third dielectric layer defining a        │
│ perimeter, a top portion of a heater material layer          │
│ partially overlapping the perimeter of the third dielectric  │
│ layer, and a bottom portion of the heater material layer     │
│ overlapping the perimeter of the third dielectric layer,     │
│ the bottom portion of the heater material layer being in     │
│ contact with the first conductive structure                  │
│ 1030                                                         │
└─────────────────────────────────────────────────────────────┘
                              ↓
┌─────────────────────────────────────────────────────────────┐
│ Forming a phase-change material above the heater element,    │
│ the top portion of the heater material layer being in        │
│ contact with a bottom surface of the phase-change material   │
│ 1040                                                         │
└─────────────────────────────────────────────────────────────┘
                              ↓
┌─────────────────────────────────────────────────────────────┐
│ Forming a second conductive structure above the              │
│ phase-change material                                        │
│ 1050                                                         │
└─────────────────────────────────────────────────────────────┘
```

FIG. 10

PHASE-CHANGE MEMORY CELL WITH REDUCED HEATER SIZE

BACKGROUND

The present invention generally relates to the field of phase-change memory (PCM) devices, and more particularly to a phase-change memory cell with reduced heater size.

Devices based on phase-change materials are being explored to implement and accelerate artificial intelligence ("AI") computing circuits. The computation is based on changing the PCM element gradually from a high resistance state (RESET operation), which is the amorphous phase, to a lower resistant state (SET operation), which is the crystalline phase. The PCM device can be used as an analog resistor, where the value of stored data is represented by a continuously variable resistance, rather than a two state, or digital, value of high or low resistance. Reducing the amount of current required by the PCM element to change its crystalline phase can beneficially decrease power dissipation and improve reliability during operation of the PCM cell. However, reducing the current flow in the PCM cell so as to provide more efficient self-heating (e.g., Joule heating) of the PCM material in the cell can be a challenging task.

SUMMARY

According to an embodiment of the present disclosure, a memory device includes a first conductive structure within a first dielectric layer, a heater element within a second dielectric layer disposed above the first conductive structure, the heater element includes a third dielectric layer defining a perimeter, a top portion of a heater material layer partially overlapping the perimeter of the third dielectric layer, and a bottom portion of the heater material layer overlapping the perimeter of the third dielectric layer, the bottom portion of the heater material layer being in contact with the first conductive structure. The memory device further includes a phase-change material above the heater element, the top portion of the heater material layer is in contact with a bottom surface of the phase-change material, and a second conductive structure above the phase-change material.

According to an embodiment of the present disclosure, a method of forming a memory device includes forming a first conductive structure within a first dielectric layer, forming a heater element within a second dielectric layer disposed above the first conductive structure, the heater element includes a third dielectric layer defining a perimeter, a top portion of a heater material layer partially overlapping the perimeter of the third dielectric layer, and a bottom portion of the heater material layer overlapping the perimeter of the third dielectric layer, the bottom portion of the heater material layer being in contact with the first conductive structure. The method further includes forming a phase-change material above the heater element, the top portion of the heater material layer is in contact with a bottom surface of the phase-change material, and forming a second conductive structure above the phase-change material.

In an embodiment, forming the heater element further includes etching the second dielectric layer to form a first opening, the first opening exposes a top surface of the first conductive structure, conformally depositing the heater material layer within the first opening, and conformally depositing a capping layer directly above the heater material layer, conducting a tilted ion implantation process on a top portion of the capping layer, the implanted top portion of the capping layer is above a top portion of a first vertical region of the heater material layer, selectively removing the implanted top portion of the capping layer to expose the top portion of the first vertical region of the heater material layer, and selectively removing the exposed top portion of the first vertical region of the heater material layer, a bottom portion of the first vertical region of the heater material layer remains below a bottom portion of the capping layer.

BRIEF DESCRIPTION OF THE DRAWINGS

The following detailed description, given by way of example and not intended to limit the invention solely thereto, will best be appreciated in conjunction with the accompanying drawings, in which:

FIG. 7A depicts a single quadrant implantation for forming a ring-shaped heater material layer, according to an embodiment of the present disclosure;

FIG. 7B depicts a dual quadrant implantation for forming a ring-shaped heater material layer, according to an embodiment of the present disclosure;

FIG. 7C depicts a triple quadrant implantation for forming a ring-shaped heater material layer, according to an embodiment of the present disclosure;

FIG. 7D depicts multiple twists of implantation angle for forming a segmented heater material layer, according to an embodiment of the present disclosure;

FIG. 7E depicts multiple twists of implantation angle for further reducing a size of the heater material layer, according to an embodiment of the present disclosure;

FIG. 10 is a flowchart depicting operational steps for the fabrication of the memory device, according to an embodiment of the present disclosure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
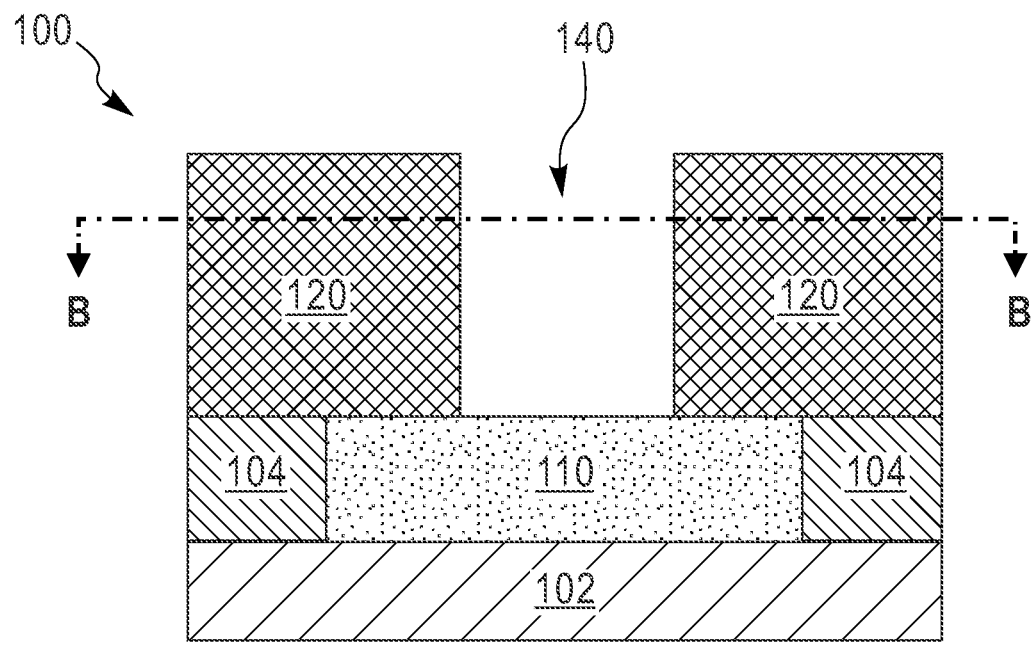
FIG. 1A is a cross-sectional view of a memory device at an intermediate step during a semiconductor manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Phase-change memory (PCM) has emerged as a viable option for both storage memory and analog computing applications. The operation of PCM devices relies on the phase change of the PCM material to produce a high resistance state (i.e., a RESET operation resulting in an amorphous phase) and a low resistance state (i.e., a SET operation resulting in a crystalline phase). A challenge of PCM devices is the high power requirement during the RESET operation, which involves melting the PCM material and quickly quenching it. Reducing the amount of current required by the PCM element to change its crystalline phase can beneficially decrease power dissipation and improve reliability during operation of the PCM cell. However, reducing the current flow in the PCM cell so as to provide more efficient self-heating (e.g., Joule heating) of the PCM material in the cell can be a challenging task. In some cases, a local heater abutting the PCM can be used to improve heating efficiency. A small local heater is often challenging to manufacture, and thus adds significantly to the cost of the PCM cell.

Therefore, embodiments of the present disclosure provide a phase-change memory (PCM) device, and a method of making the same, in which a reduced size heater element is formed between the PCM material and the bottom electrode. In the proposed embodiments, a first portion of the heater element abutting the PCM material has a partial ring shape for reducing the contact area between the PCM material and the heater element, thereby decreasing the RESET current. At the same time, a second portion of the heater element abutting the bottom electrode has a full ring shape for further reducing current crowding at a top of the heater element.

An embodiment by which the PCM device with reduced heater size can be formed is described in detailed below by referring to the accompanying drawings in FIGS. 1A-10.

Figure 1B:
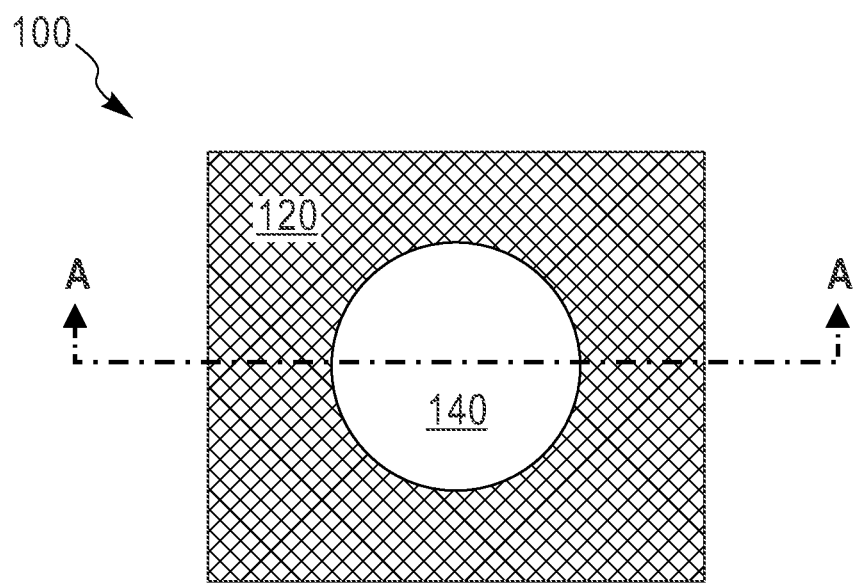
FIG. 1B is a top-down view of the memory device taken across line B-B as depicted in FIG. 1A.

Referring now to FIGS. 1A, a cross-sectional view of a memory device 100 at an intermediate step during a semiconductor manufacturing process is shown, according to an embodiment of the present disclosure. In this embodiment, FIG. 1B is a top-down view of the memory device 100 taken across line B-B as depicted in FIG. 1A, while the cross-sectional view of FIG. 1A is taken along line A-A as depicted in FIG. 1B.

In this embodiment, the memory device 100 includes a first conductive structure or bottom electrode 110 that is embedded in a first dielectric layer 104 disposed on a substrate 102.

Although not depicted in the figures, the substrate 102 may include a plurality of access devices including, but not limited to, bipolar transistors, ovonic threshold switching devices, diodes, field effect transistors (FETs) devices having a variety of different configurations, e.g., planar transistor devices, FinFET transistor devices, nanosheet transistor devices, nanowire transistor devices, and the like. The bottom electrode 110 is electrically connected to the access devices in the substrate 102. The substrate 102 may also include contact structures for establishing an electrical connection to the FET devices. In addition to active circuit elements or semiconductor devices, the substrate 102 may also include passive circuit elements such as resistors, capacitors, isolations, interconnects, etc. The substrate 102 can be a silicon substrate or any other suitable substrates, including but not limited to, silicon-on-insulator (SOI), silicon germanium, compound semiconductors, etc.

The first dielectric layer 104 may include a dielectric material such as, for example, a low-k dielectric material having a dielectric constant, k, in the range of approximately 2.4 to approximately 2.7. In some embodiments, the first dielectric layer 104 may include silicon oxide, silicon nitride, hydrogenated silicon carbon oxide, silicon carbon nitride, silicon based low-k dielectrics, porous dielectrics, or any suitable combination of those dielectric materials. The first dielectric layer 104 may be formed by any suitable deposition process including, for example, chemical vapor deposition (CVD), physical vapor deposition (PVD), and the like. In one or more embodiments, a thickness of the first dielectric layer 104 may vary from approximately 70 nm to approximately 180 nm, although thicknesses greater than 180 nm and less than 70 nm may also be used.

The bottom electrode 110 surrounded by the first dielectric layer 104 provide an interconnect level for the memory device 100. The first dielectric layer 104 and the bottom electrode 110 can be formed utilizing conventional processes that are well-known to those skilled in the art including, for example, a damascene process. So as not to obscure the method of the present application, the techniques used to form the interconnect level provided by the first dielectric layer 104 and the bottom electrode 110 are not provided herein.

According to an embodiment, the bottom electrode 110 is composed of an electrically conductive metal or metal alloy. Examples of electrically conductive materials that may be used in the present application to form the bottom electrode 110 include tungsten (W), aluminum (Al), copper (Cu), cobalt (Co), nickel (Ni), titanium (Ti), ruthenium (Ru), molybdenum (Mo), or any other suitable conductive material.

In some embodiments, a diffusion barrier liner (not shown) composed of a diffusion barrier material (i.e., a material that serves as a barrier to prevent a conductive material such as copper from diffusing there through) can be formed along a bottom surface and sidewalls of the bottom electrode 110. Examples of diffusion barrier materials that can be used in providing the diffusion barrier liner, if formed, may include, but are not limited to, Ta, TaN, Ti, TiN, Ru, RuN, RuTa, RuTaN, W, or WN. In some embodiments, the diffusion barrier liner may include a stack of diffusion barrier materials. In one example, the diffusion barrier material may be composed of a stack of Ta/TaN. In the depicted embodiment, no diffusion barrier liner is formed.

The memory device 100 further includes a second dielectric layer 120 formed above the first dielectric layer 104 and the bottom electrode 110, as depicted in the figure. The second dielectric layer 120 is composed of similar materials, and formed in similar ways, as the first dielectric layer 104. In an exemplary embodiment, the second dielectric layer 120 is formed by depositing a layer of silicon nitride (SiN). A thickness of the second dielectric layer 120 may vary between approximately 70 nm to approximately 150 nm, although thicknesses greater than 150 nm and less than 70 nm may also be used.

A first opening 140 is formed within the second dielectric layer 120 using known patterning techniques including, for example, photolithography followed by reactive ion etch (RIE) processing. As depicted in FIG. 1A, the first opening 140 exposes a top surface of the bottom electrode 110. In one or more embodiments, the first opening 140 has a substantially circular shape, as shown in FIG. 1B. It should be noted that although the opening 140 is shown as having vertical sidewall(s) in FIG. 1A, the sidewall(s) of the opening 140 can be tilted, for example, with the top portion of the opening 140 being wider or narrower than the lower portion.

Figure 2A:
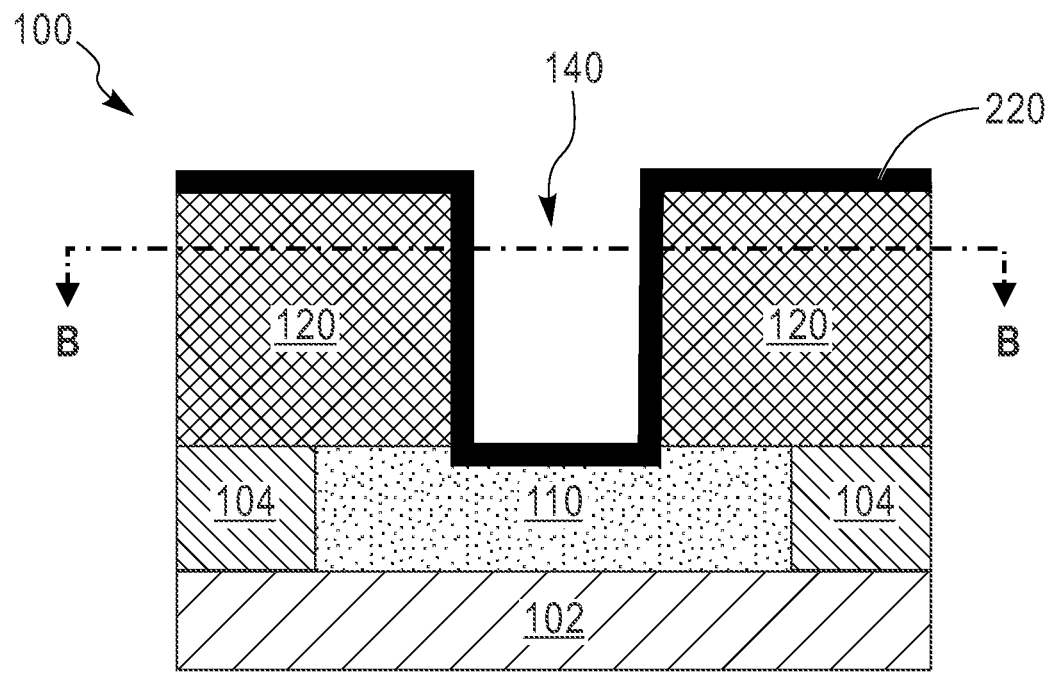
FIG. 2A is a cross-sectional view of the memory device after forming a heater material layer, according to an embodiment of the present disclosure.
Figure 2B:
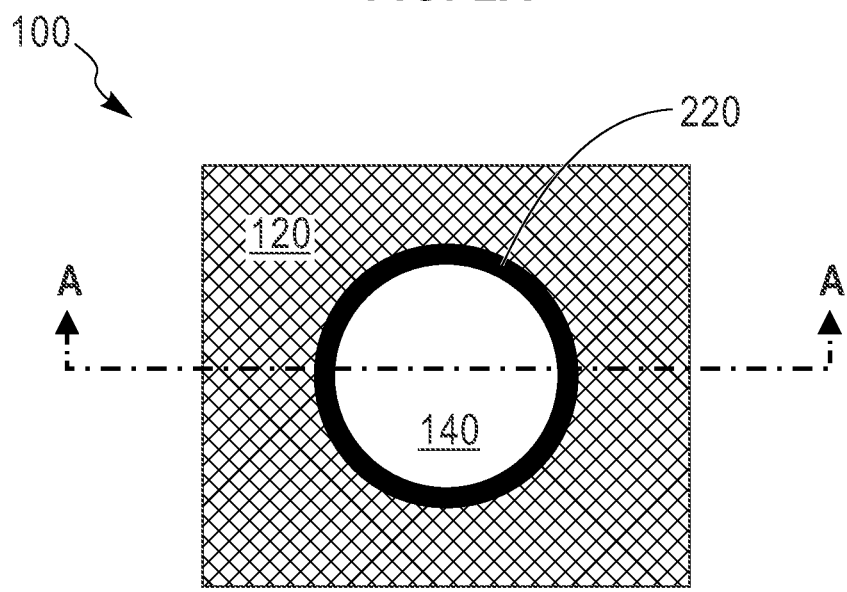
FIG. 2B is a top-down view of the memory device taken across line B-B as depicted in FIG. 2A.

Referring now to FIG. 2A, a cross-sectional view of the memory device 100 is shown after forming a heater material layer 220, according to an embodiment of the present disclosure. In this embodiment, FIG. 2B is a top-down view of the memory device 100 taken across line B-B as depicted in FIG. 2A, while the cross-sectional view of FIG. 2A is taken along line A-A as depicted in FIG. 2B.

According to an embodiment, the heater material layer 220 is conformally deposited on the memory device 100. Particularly, the heater material layer 220 is deposited within the first opening 140. As depicted in FIG. 2A, the heater material layer 220 covers an uppermost surface of the second dielectric layer 120, an exposed upper surface of the bottom electrode 110 and opposite sidewalls of the second dielectric layer 120. More particularly, as illustrated in FIG. 2B, the heater material layer 220 is formed on a perimeter of the substantially circular first opening 140 forming a ring-shaped region of the heater material layer 220 that covers inner sidewalls of the second dielectric layer 120. This ring-shaped region of the heater material layer 220 provides a ring-shaped heater element for the memory device 100.

It should be noted that, the ring-shaped region of the heater material layer 220 can also be termed "cylindrical solid". As used herein, the terms "ring-shaped" and "cylindrical solid" are not intended to be limited to circular structures, but to also include any three-dimensional structures definable by a straight line intersecting and moving along a closed plane curve. It is not necessary that the height or vertical dimension of such cylindrical solids be greater than the width or horizontal dimension. Besides the circular shape shown in FIG. 2B, the heater material layer 220 may have other shapes including, for example, an oval shape, a polygon shape, etc.

A variety of thin-film deposition methods known to those skilled in the art can be used to form the heater material layer 220, included but not limited to physical vapor deposition (PVD), chemical vapor deposition (CVD), electrochemical deposition (ECD), molecular beam epitaxy (MBE), or atomic layer deposition (ALD). Alternative deposition techniques are similarly contemplated.

In one or more embodiments, the heater material layer 220 is composed of titanium nitride (TiN), tantalum nitride (TaN), tungsten nitride (WN), titanium tungsten alloy (TiW), silicide (e.g., TiSi, WSi, CoSi), tungsten silicon nitride (WSiN), titanium silicon nitride (TiSiN), or any suitable combination of those materials. A thickness of the heater material layer 220 may vary from approximately 3 nm to approximately 10 nm, although thicknesses greater than 10 nm and less than 3 nm may also be used.

Figure 3A:
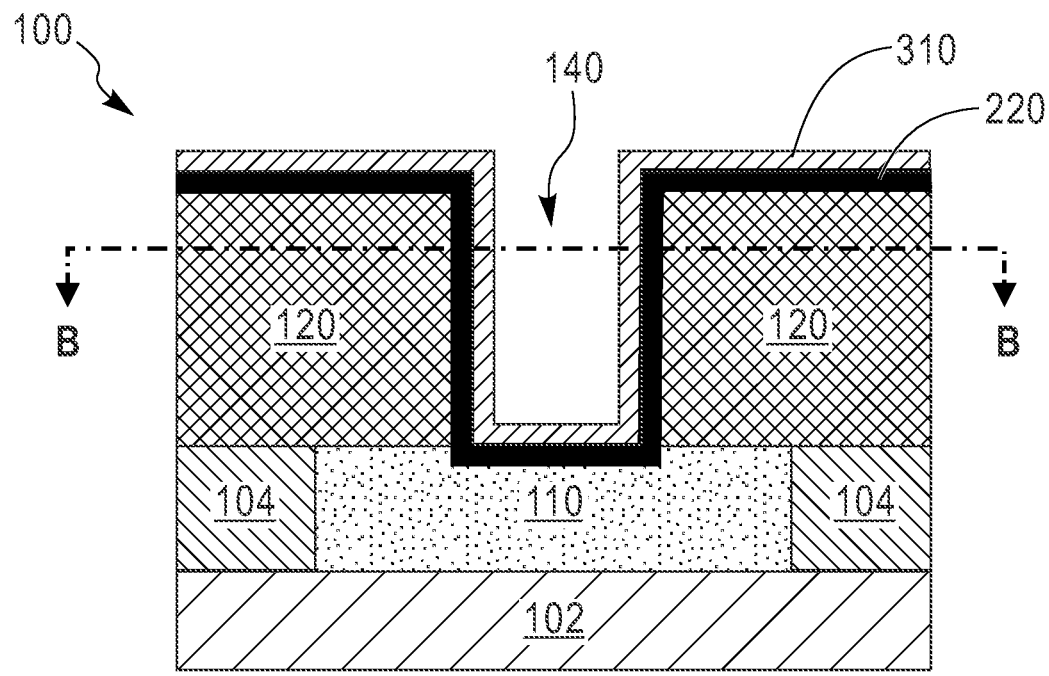
FIG. 3A is a cross-sectional view of the memory device after forming a capping layer, according to an embodiment of the present disclosure.
Figure 3B:
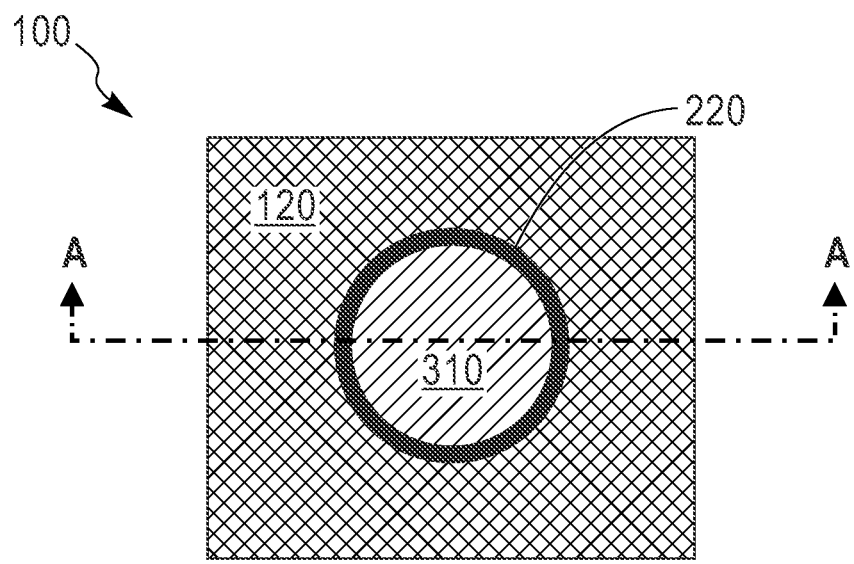
FIG. 3B is a top-down view of the memory device taken across line B-B as depicted in FIG. 3A.

Referring now to FIG. 3A, a cross-sectional view of the memory device 100 is shown after forming a capping layer 310, according to an embodiment of the present disclosure. In this embodiment, FIG. 3B is a top-down view of the memory device 100 taken across line B-B as depicted in FIG. 3A, while the cross-sectional view of FIG. 3A is taken along line A-A as depicted in FIG. 3B.

The capping layer 310 can be conformally deposited on the memory device 100 using known deposition methods including CVD, ALD, and the like. As depicted in FIG. 3A, the capping layer 310 is formed above and in direct contact with an uppermost surface of the heater material layer 220. According to an embodiment, the capping layer 310 may allow a tilted ion implantation to be conducted on the memory device 100 for subsequent removal of a portion of the heater material layer 220, as will be described in detail below. According to an embodiment, the capping layer 310 includes a conformal layer of a capping material such as silicon nitride (SiN). In an exemplary embodiment, the capping layer 310 may have a thickness of approximately 5 nm.

Figure 4A:
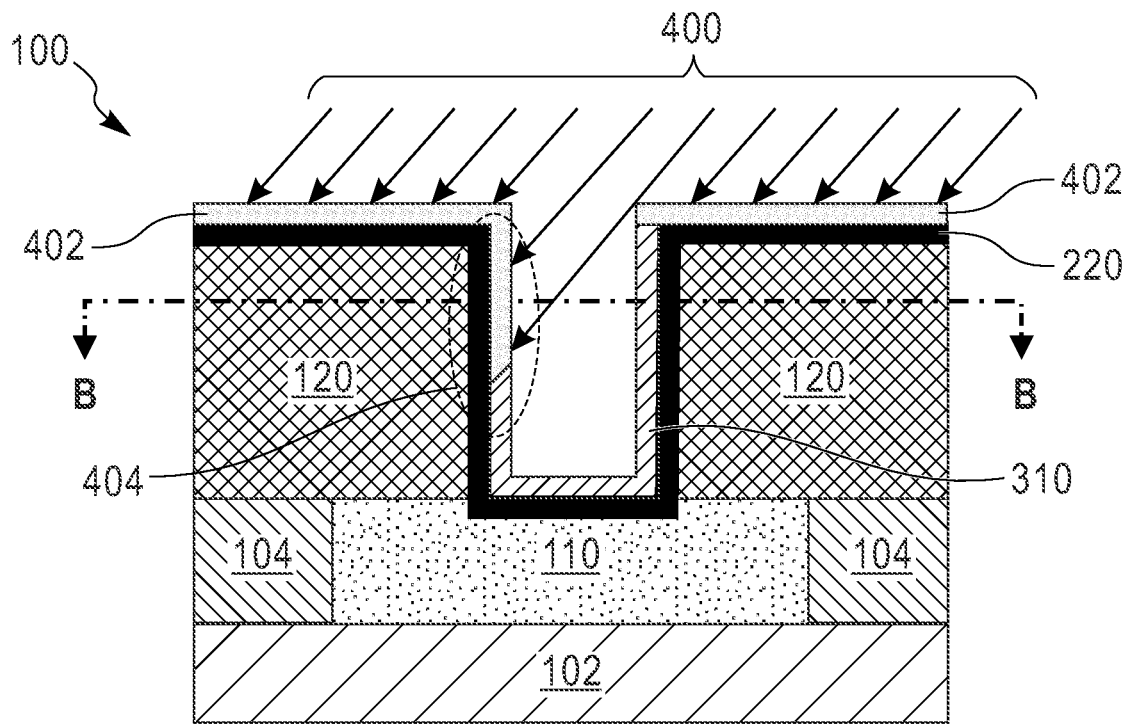
FIG. 4A is a cross-sectional view of the memory device after conducting a tilted ion implantation on the capping layer, according to an embodiment of the present disclosure.
Figure 4B:
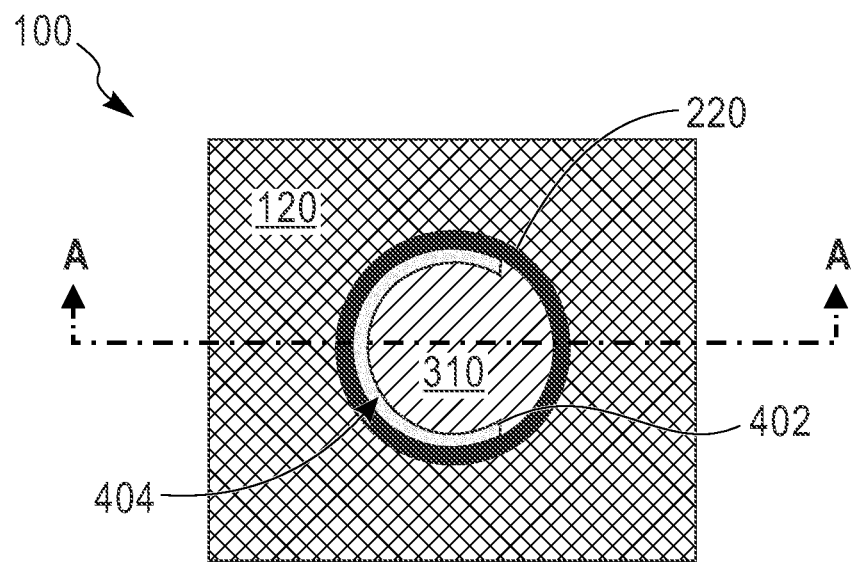
FIG. 4B is a top-down view of the memory device 100 taken across line B-B as depicted in FIG. 4A.

Referring now to FIG. 4A, a cross-sectional view of the memory device 100 is shown after conducting a tilted ion implantation on the capping layer 310, according to an embodiment of the present disclosure. In this embodiment, FIG. 4B is a top-down view of the memory device 100 taken across line B-B as depicted in FIG. 4A, while the cross-sectional view of FIG. 4A is taken along line A-A as depicted in FIG. 4B.

In this embodiment, the tilted ion implantation process allows modifying the etch properties of the (SiN) capping layer 310. For instance, a xenon (Xe) ion implantation can greatly enhance the etch rate of the (SiN) capping layer 310. In one or more embodiments, the tilted ion implantation can be conducted using, for example, 3 KeV Xe ions with a dose of $1\times10^{14}$ cm$^{-2}$ and a tilted angle of 30°. The tilted ion implantation process is depicted in FIG. 4A using arrows 400. During this process, a portion (hereinafter "implanted portion") 402 of the capping layer 310 is implanted with Xe ions to modify the etch rate of the capping layer 310.

As can be observed in FIG. 4A, the tilted implantation process allows selectively damaging a vertical portion 404 of the capping layer 310. In one or more embodiments, the ion implantation angle can be controlled to increase or decrease a size of the implanted area, i.e., the vertical portion 404 of the capping layer 310. Additional implantation species may include argon (Ar), nitrogen (N), oxygen (O), germanium (Ge), arsenic (As), or any suitable implantation species that can modify the etch properties of the capping layer 310.

Accordingly, the tilted ion implantation process can change material properties, and thus the etch rate of the implanted portions 402 of the capping layer 310 (including the vertical portion 404). This allows removing the implanted portions 402 of the capping layer 310 selective to the remaining (not implanted) portions of the capping layer 310 and the heater material layer 220, as will be described in detail below.

Figure 5A:
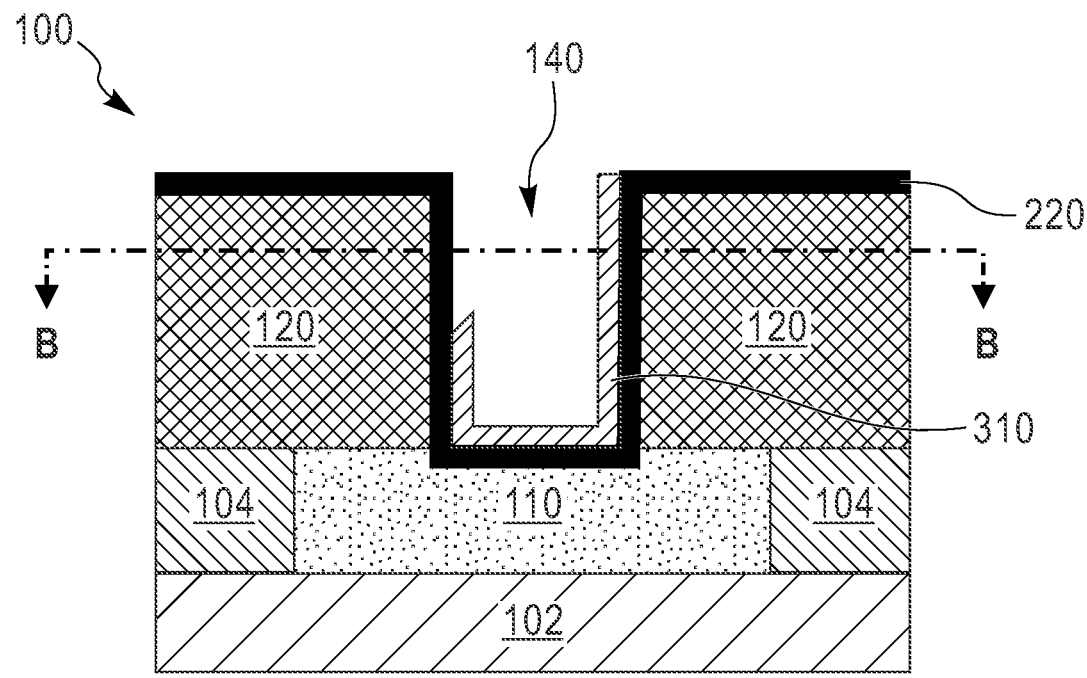
FIG. 5A is a cross-sectional view of the memory device after selectively removing implanted portions of the capping layer, according to an embodiment of the present disclosure.
Figure 5B:
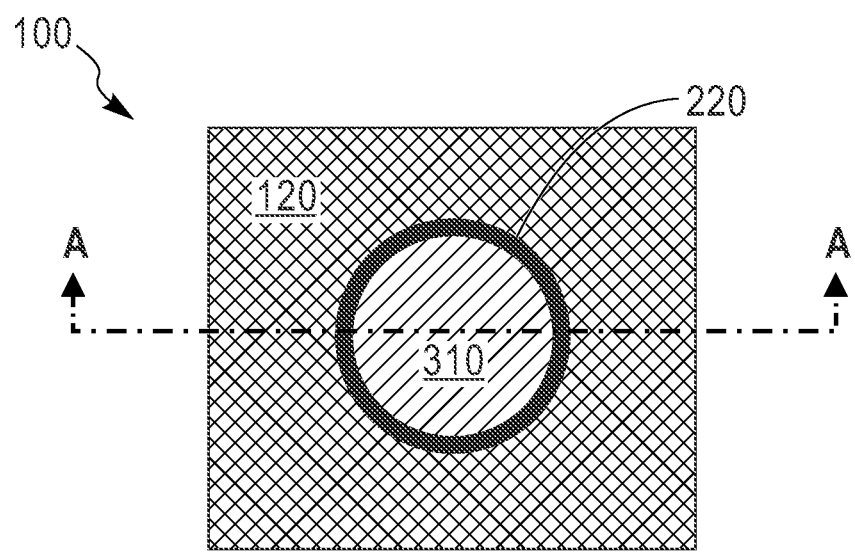
FIG. 5B is a top-down view of the memory device taken across line B-B as depicted in FIG. 5A.

Referring now to FIG. 5A, a cross-sectional view of the memory device 100 is shown after selectively removing the implanted portions 402 (FIG. 4A) of the capping layer 310, according to an embodiment of the present disclosure. In this embodiment, FIG. 5B is a top-down view of the memory device 100 taken across line B-B as depicted in FIG. 5A, while the cross-sectional view of FIG. 5A is taken along line A-A as depicted in FIG. 5B.

Known etching processes can be conducted on the memory device 100 to selectively remove the implanted portions 402 of the capping layer 310 including the vertical portion 404 depicted in FIGS. 4A-4B. For example, an aqueous solution containing diluted hydrogen fluoride (DHF) can be used to remove the implanted portion 402 of the capping layer 310 selective to the not implanted portion of the capping layer 310.

As shown in FIG. 5A, removal of the implanted portions 402 (FIGS. 4A-4B) of the capping layer 310 exposes a top horizontal region and a top vertical region of the heater material layer 220. Specifically, a bottom portion of a first vertical region of the heater material layer 220 perpendicular to the bottom electrode 110 remains covered by the (SiN) capping layer 310, while the top portion of such first vertical region of the heater material layer 220 is exposed after removal of the implanted portions 402 (FIGS. 4A-4B). As can be observed in FIG. 5A, the capping layer 310 fully covers a bottom horizontal region of the heater material layer 220 disposed above the bottom electrode 110 and a second vertical region of the heater material layer 220 opposing the first vertical region of the heater material layer 220.

Figure 6A:
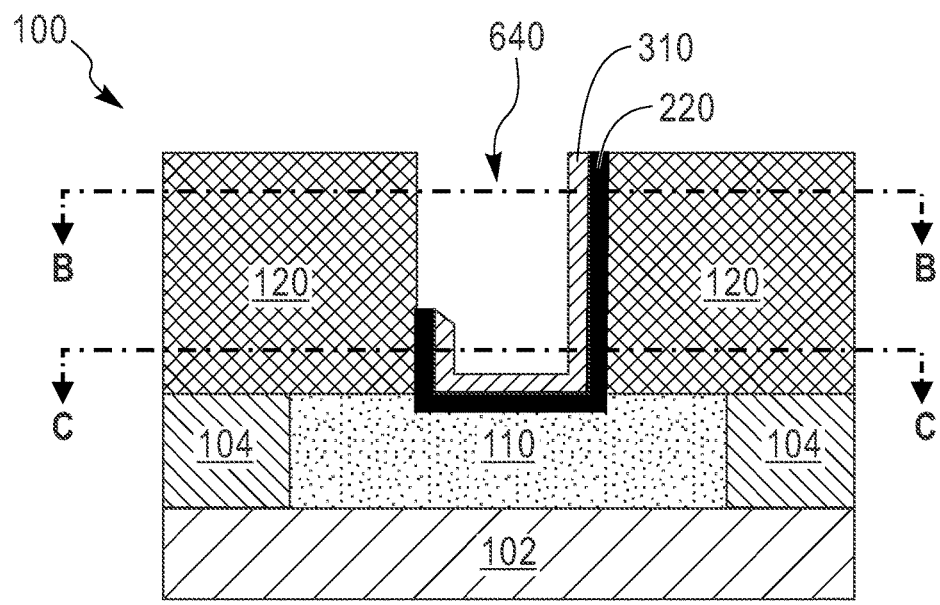
FIG. 6A is a cross-sectional view of the memory device after removing an exposed top portion of a first vertical region of the heater material layer, according to an embodiment of the present disclosure.
Figures 6B, 6C:
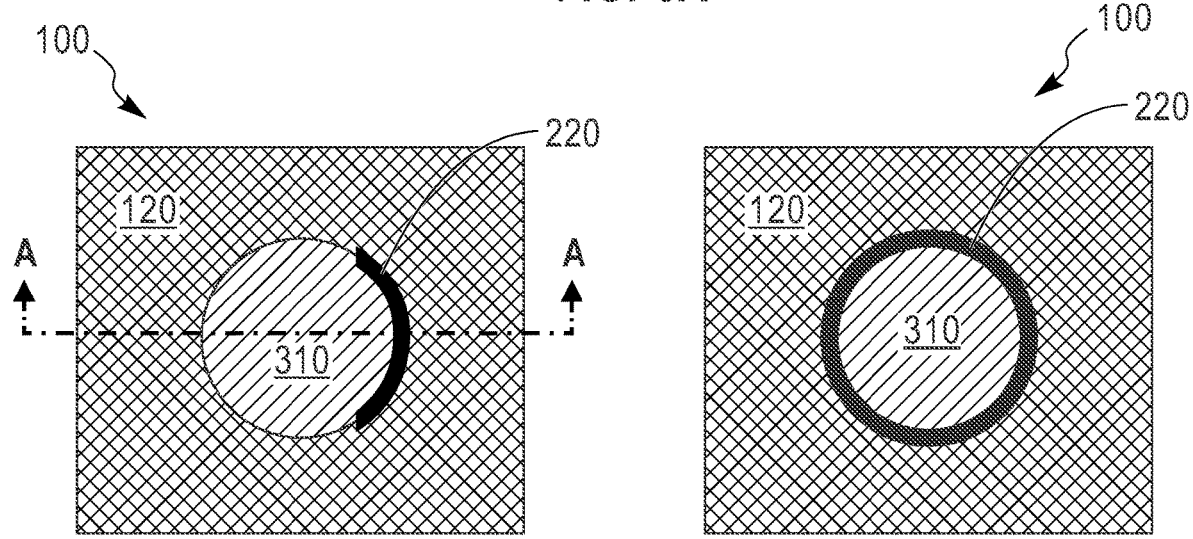
FIG. 6B is a top-down view of the memory device taken across line B-B as depicted in FIG. 6A.
FIG. 6C is a top-down view of the memory device taken across line C-C as depicted in FIG. 6A.

Referring now to FIG. 6A, a cross-sectional view of the memory device 100 is shown after removing the exposed top portion of the first vertical region of the heater material layer 220, according to an embodiment of the present disclosure. In this embodiment, FIG. 6B is a top-down view of the memory device 100 taken across line B-B as depicted in FIG. 6A; FIG. 6C is a top-down view of the memory device 100 taken across line C-C as depicted in FIG. 6A; and the cross-sectional view of FIG. 6A is taken along line A-A as depicted in FIG. 6B.

In this step, the top portion of the first vertical region of the heater material layer 220 exposed after removing the implanted portions 402 (FIGS. 4A-4B) of the capping layer 310 are removed using any suitable etching technique. For example, an aqueous solution containing a mix of ammonia (NH$_4$OH) and hydrogen peroxide (H$_2$O$_2$) can be used to remove exposed the (TiN) heater material layer 220 selective to the (SiN) capping layer 310.

As depicted in FIG. 6B, by etching the exposed top portion of the first vertical region of the heater material layer 220, a portion of the material layer 220 is removed from an upper region of the ring-shaped heater element. By doing this, the contact area between a top portion of the ring-shaped heater material layer 220 and a subsequently form PCM material can be reduced. As may be understood, by reducing a size of the heating element (i.e., heater material layer 220), a programming current of the PCM cell can also be reduced thereby improving PCM performance. As depicted in FIG. 6C, a bottom portion of the ring-shaped heater material layer 220 abutting the bottom electrode 110 remains complete.

It should be noted that the ion implantation process can be conducted with different twist angles in order to achieve different heater element shapes. For example, FIGS. 7A through 7E illustrate different shapes for the heater material layer 220 that can be achieved by changing the implantation angle. Specifically, FIG. 7A depicts a single quadrant implantation that can remove about a quarter of the ring-shaped heater material layer 220; FIG. 7B depicts a dual quadrant implantation that can remove about a half of the ring-shaped heater material layer 220 leaving two opposite portions of the heater material layer 220; FIG. 7C depicts a triple quadrant implantation that can remove about three quarters of the ring-shaped heater material layer 220; FIG. 7D depicts multiple twists of implantation angle to form a segmented heater material layer 220; and FIG. 7D depicts multiple twists of implantation angle to further reduce a size of the heater material layer 220.

Accordingly, the implantation angle can be selected or tuned based on a desired shape of the heater material layer 220, such that the contact area between the heating element and the subsequently formed PCM cell can be controlled.

After removing the implanted portions 402 (FIGS. 4A-4B) of the capping layer 310 and the exposed top portion of the first vertical region of the heater material layer 220, a second opening 640 (i.e., heater via) remains in the memory device 100, as depicted in FIG. 6A. The second opening 640 can be subsequently filled with an insulator material, as will be described in detail below.

Figure 8A:
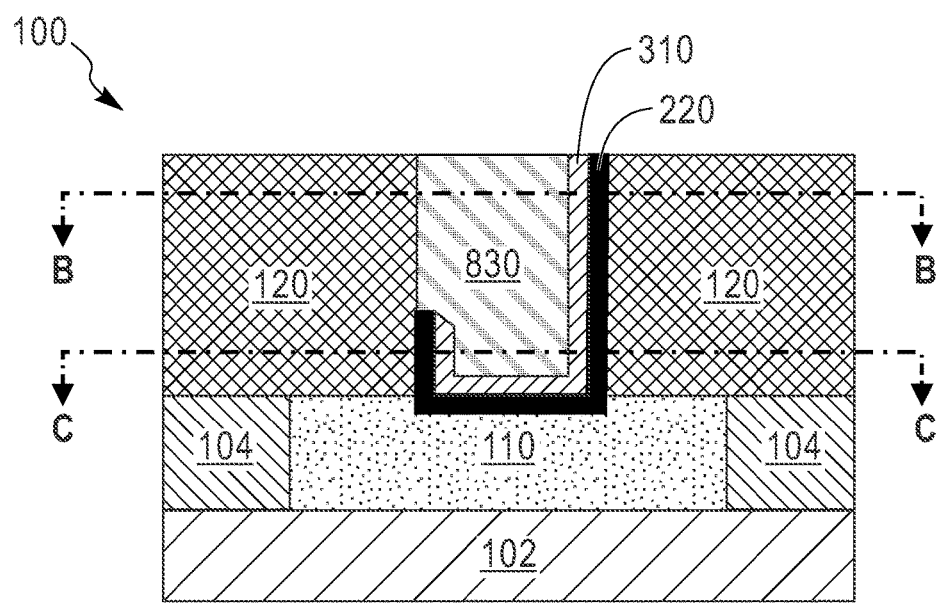
FIG. 8A is a cross-sectional view of the memory device after depositing a third dielectric material, according to an embodiment of the present disclosure.
Figures 8B, 8C:
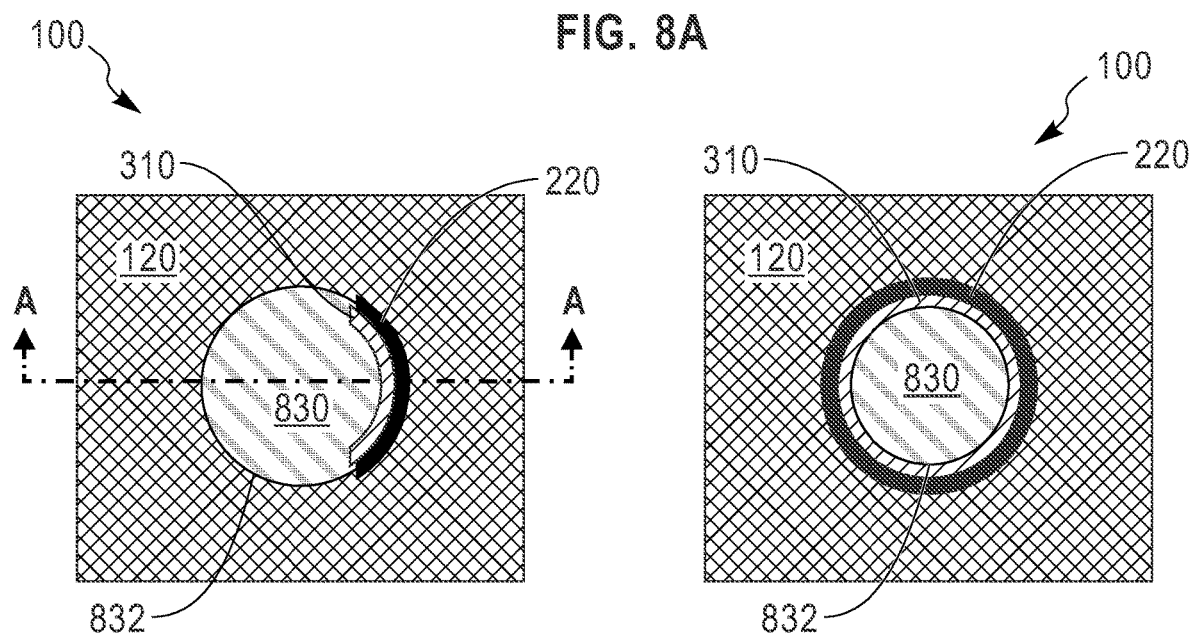
FIG. 8B is a top-down view of the memory device taken across line B-B as depicted in FIG. 8A.
FIG. 8C is a top-down view of the memory device taken across line C-C as depicted in FIG. 8A.

Referring now to FIG. 8A, a cross-sectional view of the memory device 100 is shown after depositing a third dielectric layer 830, according to an embodiment of the present disclosure. In this embodiment, FIG. 8B is a top-down view of the memory device 100 taken across line B-B as depicted in FIG. 8A; FIG. 8C is a top-down view of the memory device 100 taken across line C-C as depicted in FIG. 8A; and the cross-sectional view of FIG. 8A is taken along line A-A as depicted in FIG. 8B.

The third dielectric layer 830 is formed within the second opening 640 (FIG. 6A) to enhance the mechanical stability of the memory device 100. In an embodiment, the third dielectric layer 830 can be formed by depositing a layer of an electrical insulator material such as, for example, silicon oxynitride (SiON), silicon oxycarbide (SiOC), silicon carbon nitride (SiCN), etc. In other embodiments, a layer of a highly resistive material such as nitrogen-rich tantalum nitride (TaN) can be used to form the third dielectric layer 830. Known deposition processes can be used to form the third dielectric layer 830 including, for example, CVD. The third dielectric layer 830 substantially fills the second opening 640 shown in FIG. 6A.

After forming the third dielectric layer 830, a first planarization process can be conducted on the memory device 100 such that a top surface of the third dielectric layer 830 is coplanar with top surfaces of the second dielectric layer 120, capping layer 310 and the second vertical region of the heater material layer 220. In an exemplary embodiment, the planarization process includes a chemical mechanical polishing (CMP) process.

According to an embodiment, the third dielectric layer 830 defines a perimeter 832. The perimeter 832 on a top portion of the third dielectric layer 830, depicted in FIG. 8B, is partially overlapped or covered by a top portion of the capping layer 310 and a top portion of the heater material layer in contact with the capping layer 310. Further, the perimeter 832 on a bottom portion of the third dielectric layer 830, depicted in FIG. 8C, is completely overlapped or covered by a bottom portion of the capping layer 310 and a bottom portion of the heater material layer in contact with the capping layer 310. This configuration provides a reduced size heater element for the memory device 100.

Figure 9:
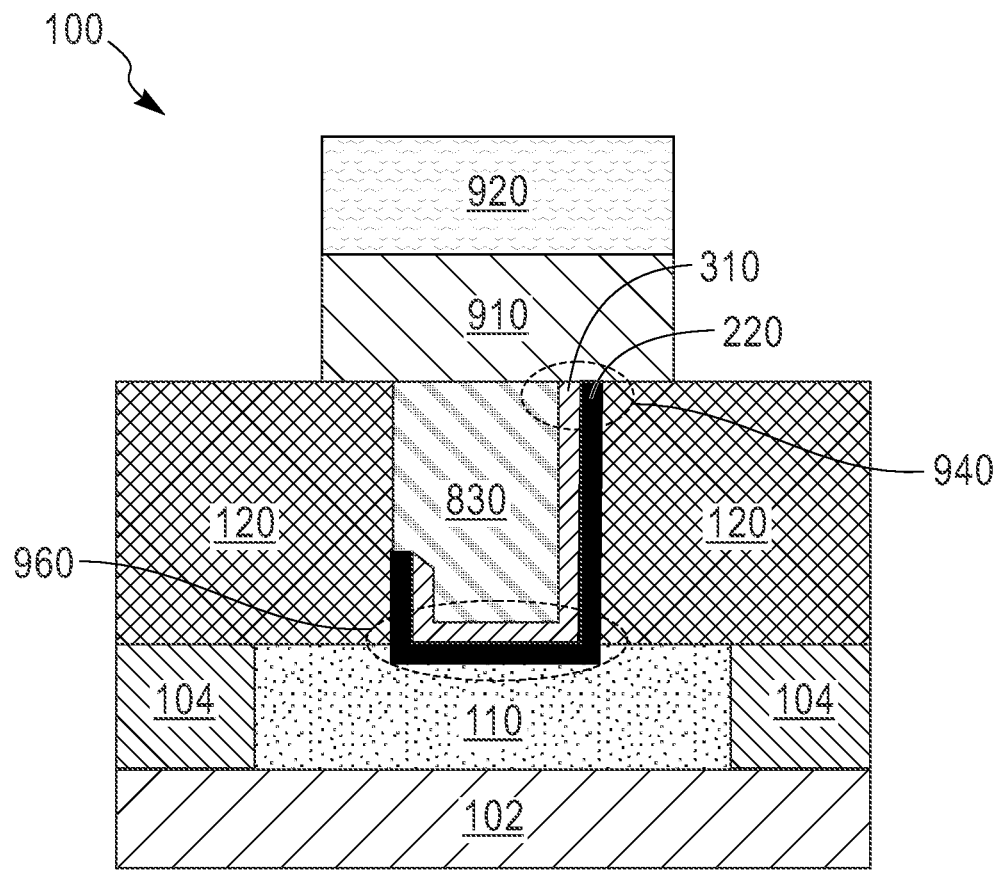
FIG. 9 is a cross-sectional view of the memory device after forming and patterning a phase-change material and a top electrode, according to an embodiment of the present disclosure.

Referring now to FIG. 9, a cross-sectional view of the memory device 100 is shown after forming and patterning a phase-change material 910 and a top electrode 920, according to an embodiment of the present disclosure.

Non-limiting examples of materials for forming the phase-change material 910 may include a Ge—Sb—Te (germanium-antimony-tellurium or "GST") alloy. Alternatively, other suitable materials for the phase-change material 910 include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase-change material 910 can further include nitrogen, carbon, and/or oxygen. In some embodiments, the phase-change material 910 can be doped with dielectric materials including but not limited to aluminum oxide, silicon oxide, tantalum oxide, hafnium oxide, zirconium oxide, cerium oxide, silicon nitride, silicon oxynitride, germanium oxide, germanium nitride, germanium oxynitride, etc.

An example method for forming the phase-change material 910 includes, preferably, a conformal deposition process such as atomic layer deposition (ALD), or chemical vapor deposition (CVD). In some embodiments, a resistive liner (not shown) is deposited before the deposition of the phase-change material 910. The resistive liner materials can be, for example, aluminum nitride (AlN), boron nitride (BN), aluminum oxide (AlO), TaN, TiN, tungsten nitride (WN), cobalt tungsten (CoW), nickel tungsten (NiW), or yttrium oxide (YO), or any combination thereof. The resistance of resistive liner is substantially greater than the resistance of the heater (e.g., five to fifty times higher, or about twenty times higher). Furthermore, the resistance of the resistive liner is substantially greater than the resistance of the phase-change material 910 in a low resistance, polycrystalline state (e.g., ten to forty times higher, or about twenty times higher) and substantially lower than the resistance of the phase-change material 910 in high resistance, amorphous state (e.g., five to fifty times lower, or about ten times lower). The resistivity of the resistive liner can be, for example, in the range of 0.1 ohm micrometers (22 μm) to 1 kiloohm micrometers (kΩμm). The resistive liner can be deposited by any suitable technique, including but not limited to ALD, PVD, CVD, etc.

In one or more embodiments, the phase-change material 910 is capable of being switched between a first structural state in which the material is in a generally amorphous solid phase, and a second structural state in which the material is in a generally crystalline solid phase in its local order in the active channel region of the cell. Phase change materials are at least bistable. The term amorphous is used to refer to a relatively less ordered structure, more disordered than a crystalline structure, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase.

Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

After forming the phase-change material 910, a conductive material can be deposited directly above the phase-change material 910 to form a second conductive structure or top electrode 920. The conductive material forming the top electrode 920 may be formed using standard deposition methods such as, for example, CVD. In an embodiment, the top electrode 920 may be composed of a single conductive material (e.g., TiN), multiple materials (e.g., TaN/Ti/TiN), or a conductive material surrounded by a liner (e.g., W surrounded by a TaN liner). As known by those skilled in the art, materials and processes used for forming the bottom electrode 110 can also be used for forming the top electrode 920.

A patterning process is subsequently conducted on the top electrode 920 and phase-change material 910 to obtain the configuration depicted in FIG. 9. The process of patterning the top electrode 920 and phase-change material 910 consists of steps well-known in the art, which generally include forming a pattern on a masking layer (not shown), such as a layer of photoresist or a polymer layer, that is transferred to a hardmask layer (not shown) and used to pattern the underlying top electrode 920 and phase-change material 910 via any suitable etching technique.

The proposed embodiments provide a memory device 100 in which the contact area between a top portion 940 of the heater material layer 220 and the phase-change material 910 is substantially reduced by forming a partial ring-shaped heater material layer 220 on the top portion 940 of the heating element, as depicted in FIG. 8B. This may help reducing the RESET current. Additionally, the proposed embodiments provide a (whole) heater material layer 220, i.e., a complete ring-shaped heater material layer 220 (as shown in FIG. 8C) on a lower portion 960 of the heater element. This may increase the contact area between the bottom electrode 110 and the heater material layer 220, which may also help reducing current crowding at the top portion 940 of the heating element (e.g., full ring-shaped heater to partial ring-shaped heater). Thus, the proposed configuration provides localized heating in close proximity to the interface between the heater material layer 220 and the phase-change material 910.

Referring now to FIG. 10, a flowchart 1010 sets forth operational steps for the fabrication of the memory device 100 described above with reference to FIGS. 1A-9, according to an embodiment of the present disclosure.

At step 1020, a first conductive structure is formed within a first dielectric layer.

At step 1030, a heater element is formed within a second dielectric layer disposed above the first conductive structure. The heater element includes a heater material layer in which a top portion of the heater material layer has a partial ring shape and a bottom portion of the heater material layer has a (full) ring shape. Stated differently, the heater element includes a third dielectric layer defining a perimeter, a top portion of a heater material layer partially covers or overlaps the perimeter of the third dielectric layer, and a bottom portion of the heater material layer overlaps the perimeter of the third dielectric layer.

In one or more embodiments, forming the heater element further includes etching the second dielectric layer to form a first opening, the first opening exposes a top surface of the first conductive structure, conformally depositing the heater material layer within the first opening, and conformally depositing a capping layer directly above the heater material layer. In an exemplary embodiment, the capping layer includes a conformal layer of silicon nitride.

In one or more embodiments, forming the heater element further includes conducting a tilted ion implantation process on a top portion of the capping layer, the implanted top portion of the capping layer is located above a top portion of a first vertical region of the heater material layer, selectively removing the implanted top portion of the capping layer to expose the top portion of the first vertical region of the heater material layer, and selectively removing the exposed top portion of the first vertical region of the heater material layer, a bottom portion of the first vertical region of the heater material layer remains below a bottom portion of the capping layer. A second vertical region of the heater material layer opposing the first vertical region of the heater material layer is covered by the capping layer.

In one or more embodiments, the third dielectric layer is formed above the capping layer, a top surface of the third dielectric layer is coplanar with the second dielectric layer, the second vertical region of the capping layer and the capping layer above the second vertical region of the capping layer.

In one or more embodiments, the heater material layer is formed with different partial ring shapes by changing an ion implantation angle during the tilted ion implantation process. The different partial ring shapes including at least one of a quarter of a ring, a half of a ring, three quarters of a ring, and a segmented ring.

At step 1040, a phase-change material is formed above the heater element. The top portion of the heater material layer is in contact with a bottom surface of the phase-change material. In one or more embodiments, the top portion of the heater material layer having a partial ring shape reduces a contact area between the heater material layer and the phase-change material. The phase-change material can be selected from the group consisting of: Ge—Sb—Te alloys, Si—Sb—Te alloys, Ga—Sb—Te alloys, Ge—Bi—Te alloys, In—Se alloys, As—Sb—Te alloys, Ag—In—Sb—Te alloys, Ge—In—Sb—Te alloys, Ge—Sb alloys, Sb—Te alloys, and Si—Sb alloys.

Finally, at step 1050, a second conductive structure is formed above the phase-change material.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which includes one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
    a first conductive structure within a first dielectric layer;
    a heater element within a second dielectric layer disposed above the first conductive structure, the heater element including a third dielectric layer defining a perimeter, a top portion of a heater material layer partially overlapping the perimeter of the third dielectric layer, and a bottom portion of the heater material layer overlapping the perimeter of the third dielectric layer, the bottom portion of the heater material layer being in contact with the first conductive structure, wherein the top portion of the heater material layer has a partial ring shape and the bottom portion of the heater material layer has a full ring shape;
    a phase-change material being positioned above the heater element, a partial ring shape portion of the top portion of the heater material layer being in contact with a bottom surface of the phase-change material, wherein the phase-change material is doped with at least one dielectric material; and
    a second conductive structure being positioned above the phase-change material.

2. The memory device of claim 1, wherein the heater element further comprises:
    a capping layer located between, and in direct contact with, the third dielectric layer and the heater material layer, wherein a first vertical portion of the third dielectric layer is partially covered by a first vertical portion of the capping layer and the heater material layer above the capping layer, a second vertical portion of the third dielectric layer opposing the first vertical portion of the third dielectric layer being covered by a second vertical portion of the capping layer and the heater material layer above the capping layer.

3. The memory device of claim 2, wherein the second vertical portion of the heater material layer and the capping layer is in direct contact with the bottom surface of the phase-change material.

4. The memory device of claim 1, wherein the partial ring shape portion of the heater material layer includes the partial ring shape selected from a group consisting of a quarter of a ring, a half of a ring, three quarters of a ring, and a segmented ring, wherein the partial ring shape is adapted to reduce a contact area of the heater material layer.

5. The memory device of claim 1, wherein the first conductive structure comprises a bottom electrode and the second conductive structure comprises a top electrode.

6. The memory device of claim 1, wherein the phase-change material is selected from a group consisting of: Ge—Sb—Te alloys, Si—Sb—Te alloys, Ga—Sb—Te alloys, Ge—Bi—Te alloys, In—Se alloys, As—Sb—Te alloys, Ag—In—Sb—Te alloys, Ge—In—Sb—Te alloys, Ge—Sb alloys, Sb—Te alloys, and Si—Sb alloys.

7. The memory device of claim 1, further comprising:
    a substrate located below the first conductive structure, the substrate including a plurality of access devices.

8. A method of forming a memory device, comprising:
    forming a first conductive structure within a first dielectric layer;
    forming a heater element within a second dielectric layer disposed above the first conductive structure, the heater element including a third dielectric layer defining a perimeter, a top portion of a heater material layer partially overlapping the perimeter of the third dielectric layer, and a bottom portion of the heater material layer overlapping the perimeter of the third dielectric layer, the bottom portion of the heater material layer being in contact with the first conductive structure, wherein the top portion of the heater material layer has a partial ring shape and the bottom portion of the heater material layer has a full ring shape;
    forming a phase-change material above the heater element, a partial ring shape portion of the top portion of the heater material layer being in contact with a bottom surface of the phase-change material;
    doping the phase-change material with at least one dielectric material; and
    forming a second conductive structure above the phase-change material.

9. The method of claim 8, wherein forming the heater element comprises:
    etching the second dielectric layer to form a first opening, the first opening exposing a top surface of the first conductive structure;

conformally depositing the heater material layer within the first opening; and conformally depositing a capping layer directly above the heater material layer.

10. The method of claim 9, wherein the capping layer comprises a conformal layer of silicon nitride.

11. The method of claim 9, further comprising:

conducting a tilted ion implantation process on a top portion of the capping layer, wherein the implanted top portion of the capping layer is above a top portion of a first vertical region of the heater material layer;

selectively removing the implanted top portion of the capping layer to expose the top portion of the first vertical region of the heater material layer; and selectively removing the exposed top portion of the first vertical region of the heater material layer, a bottom portion of the first vertical region of the heater material layer remaining below a bottom portion of the capping layer.

12. The method of claim 11, wherein a second vertical region of the heater material layer opposing the first vertical region of the heater material layer is covered by the capping layer.

13. The method of claim 8, wherein the top portion of the heater material layer partially covering the perimeter of the third dielectric layer reduces a contact area between the heater material layer and the phase-change material.

14. The method of claim 12, further comprising:

forming the third dielectric layer above the capping layer, a top surface of the third dielectric layer being coplanar with the second dielectric layer, the second vertical region of the heater material layer and the capping layer above the second vertical region of the heater material layer.

15. The method of claim 8, wherein the partial ring shape portion of the heater material layer includes the partial ring shape selected from a group consisting of a quarter of a ring, a half of a ring, three quarters of a ring, and a segmented ring, achieved by changing an ion implantation angle.

16. The method of claim 15, wherein the conducting the tilted ion implantation process includes xenon ions with a tilted angle of 30°.

17. The method of claim 8, wherein the first conductive structure comprises a bottom electrode and the second conductive structure comprises a top electrode.

18. The method of claim 8, wherein the phase-change material is selected from a group consisting of: Ge—Sb—Te alloys, Si—Sb—Te alloys, Ga—Sb—Te alloys, Ge—Bi—Te alloys, In—Se alloys, As—Sb—Te alloys, Ag—In—Sb—Te alloys, Ge—In—Sb—Te alloys, Ge—Sb alloys, Sb—Te alloys, and Si—Sb alloys.

* * * * *